United States Patent [19]

Chasek

[11] 4,344,145

[45] Aug. 10, 1982

[54] DISPLAY METHOD AND APPARATUS FOR EFFICIENTLY COMMUNICATING THE STATUS OF AN ONGOING PROCESS OR SYSTEM BY THE SIMULTANEOUS DISPLAY OF MANY NORMALIZED PARAMETER DEVIATIONS

[76] Inventor: Norman E. Chasek, 24 Briar Brae Rd., Stamford, Conn. 06903

[21] Appl. No.: 84,369

[22] Filed: Oct. 12, 1979

[51] Int. Cl.$^3$ .............................................. G06F 3/14
[52] U.S. Cl. .................................. 364/551; 364/521; 340/747
[58] Field of Search ............... 364/551, 710, 521, 431, 364/504, 571; 340/741, 715, 722, 747, 736

[56] References Cited

U.S. PATENT DOCUMENTS

| | | | |
|---|---|---|---|
| 2,910,681 | 10/1959 | Mita | 340/743 X |
| 3,474,438 | 10/1969 | Lauher | 340/722 X |
| 3,725,901 | 4/1973 | Lehari et al. | 340/722 |
| 3,787,666 | 1/1974 | Schumann et al. | 364/521 X |
| 3,811,040 | 5/1974 | Weinfurt et al. | 340/741 X |
| 4,001,807 | 1/1977 | Dallimonti | 340/722 X |
| 4,139,903 | 2/1979 | Morrill, Jr. et al. | 364/521 X |
| 4,143,416 | 5/1979 | Luger et al. | 364/504 |
| 4,181,956 | 1/1980 | Schwab et al. | 340/747 X |
| 4,188,627 | 2/1980 | Alexander et al. | 340/747 |
| 4,228,432 | 10/1980 | Osborne | 364/521 X |

*Primary Examiner*—Edward J. Wise

*Attorney, Agent, or Firm*—Parmelee, Bollinger & Bramblett

[57] ABSTRACT

The management of complex ongoing systems and processes such as nuclear power plants, although increasingly computerized, requires better methods of real time coupling in of the unique capability of the human brain, namely judgment. This invention describes how quantities of complex, interdependent data can be organized and presented to humans for efficient absorption by the judgment centers of the brain. Deviations of all measured parameters that describe the ongoing status of a system or process are simultaneously plotted in pre-assigned wedge-like sectors arranged into a circle, with angular displacement in each sector representing elapsed time and radial displacement from the outer periphery of the circle, indicating deviations from a normalized mean acceptable level of each parameter. Three prioritized concentric zones indicate maximum acceptable deviations, unacceptable deviations and critical deviations. Acceptable deviations are compressed to de-emphasize their impact. The direction of each deviation from mean accepted levels is marked by plus and minus indicating symbols. The most significant deviations fall toward the center of the display pattern where a fixed eyeball position can ingest larger quantities of information with good resolution and good interpretive intelligence. A preferred apparatus for generating the display is described using a cathode ray tube.

14 Claims, 5 Drawing Figures

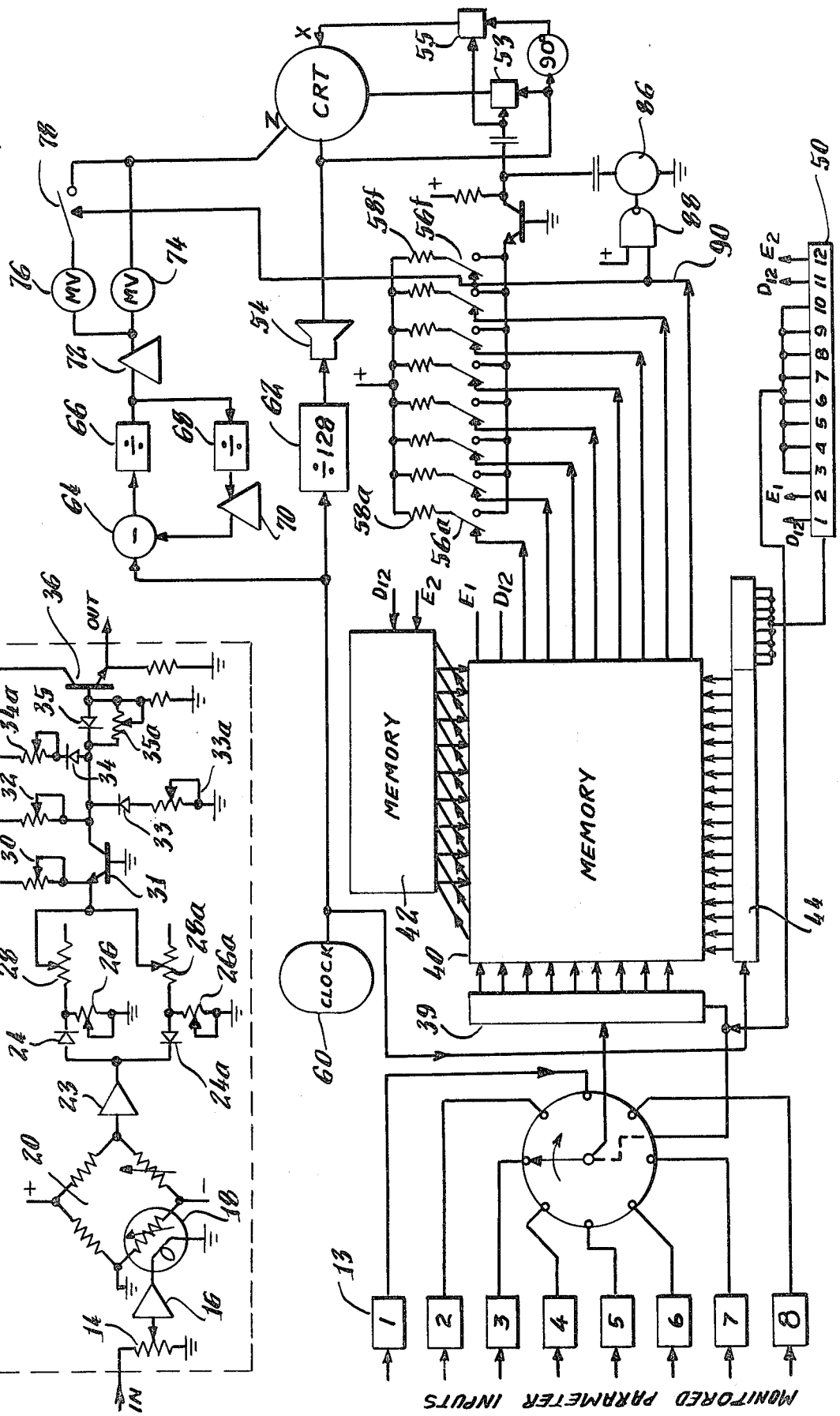

DISPLAY METHOD AND APPARATUS FOR EFFICIENTLY COMMUNICATING THE STATUS OF AN ONGOING PROCESS OR SYSTEM BY THE SIMULTANEOUS DISPLAY OF MANY NORMALIZED PARAMETER DEVIATIONS

BACKGROUND OF THE INVENTION

The basic advantage of the human link to a system or process is man's ability to rationalize and to reach a logical decision to situations deviating from the normal. Thus, in order to employ this ability, data must be available and presented in a manner enabling the man to quickly recognize the data characteristic, compare it to known acceptable characteristics and conclude whether or not a problem exists.

Several problems exist in developing a display system that creates the desired control responses. Some of these are:

1. The ability to read the display meters with required accuracy.
2. To evaluate the readings versus acceptable values where acceptable values may vary from parameter to parameter.
3. To detect abnormal conditions quickly before the characteristic condition becomes serious.
4. Evaluate deviations from normal against the need for corrective actions.

It is obvious that a large conventional instrument panel will contain many types of meters ranging from digital displays to multipoint recorders. A man checking this panel must first establish what parameter a particular meter is reading, the value of its scale divisions and the safe limit of the parameter. This represents a considerable amount of thought and integration for each meter and a vastly larger evaluation problem where many meters exist.

The evaluation of these readings against acceptable limits is even more complex since acceptable limits vary for each parameter displayed.

The detection of abnormal conditions depends on the operator evaluating every meter reading, its relative position in the normal operating range and the rate it may be changing. Unless an operator is alert and is continuously checking the instrument panel, the probability of detecting an abnormal reading is small and may not occur until serious system trouble exists.

When deviations are detected, the need for corrective action must be determined and should be based on the parameter deviation and the rate at which it is changing.

SUMMARY OF THE INVENTION

A display method, patterns and illustrative apparatus that enables a person to quickly visualize real time conditions in a complex system or process by means of a simultaneous graphic display comprised of a number of measured parameters. The display plots real time histograms into wedge-like segments that are assembled into a circle. Radial displacement of the plot from the outer periphery of the circle, in each wedge, is related to that parameter's deviations from mean acceptable levels.

Angular displacements represent time, past and present. As time progresses fresh data is added, the oldest data is removed, while the remaining data is rotated. Mean acceptable parameter levels are established and normalized so that they produce markings on the outer periphery of the display circle. Maximum acceptable deviation levels are established, for each parameter, then normalized and compressed to produce markings that reach to a second smaller concentric circle. Critical deviation from the mean levels, for each parameter, are also normalized making these markings fall within a smaller concentric circle. The deviation direction is indicated by a plus or minus indicating symbol.

The illustrative apparatus used to implement the display includes a normalizing wheatstone bridge circuit in which one arm is comprised of a voltage controlled resistor element. The mean acceptable voltage level for each parameter nulls the bridge. Diode-resistor circuits normalize and compress these deviations appropriately. The resulting voltage magnitudes are then sampled, converted to binary numbers and stored in a memory. The stored data, continually refreshed and shifted, provides the basis for generating the real time histograms. The clock that controls the entire process also acts to phase lock a sine wave generator, at a much lower frequency, which is then applied to the x and y axis of a cathode ray tube with a 90° phase shift on one axis to produce radial displacements. Modulators, controlled by a digital to analogue converting resistor-switch network, controls the radial displacements. A second frequency divider network, which periodically omits a pulse, activates the z axis of the CRT creating the simultaneous plot of as many as 32 different histograms. The direction of the deviations plotted are marked, in this example, by either angular or radial extended markings, depending on the polarity.

The various aspects and advantages of this invention will be more fully understood from a consideration of the following detailed description in conjunction with the accompanying drawings.

BRIEF DESCRIPTION OF THE DRAWINGS

FIG. 4 illustrates a preferred circuit to normalize and process the voltages received that are indicative of a parameter's amplitude.

FIG. 5 illustrates a preferred circuit for generating the display.

DETAILED DESCRIPTION OF THE DRAWINGS

Figure 1:
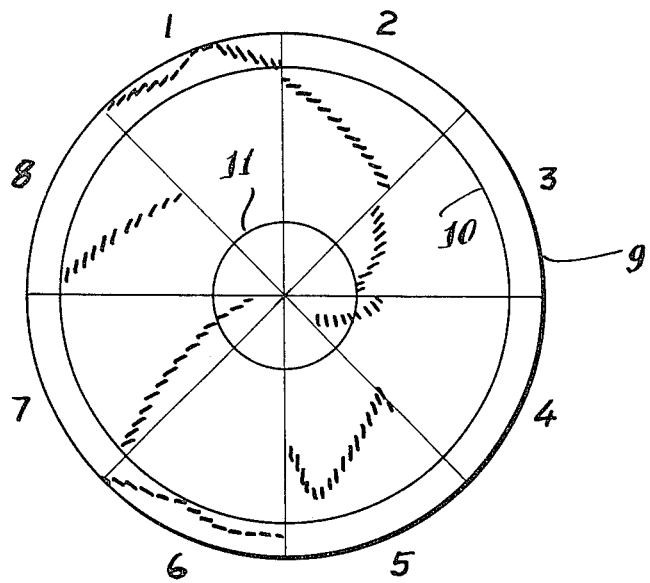
FIG. 1 illustrates the basic display pattern.

FIG. 1 illustrates the basic display pattern of the invention. In this example, the display is divided in 8 equal wedge shaped sectors 1-8. The outer periphery of the resulting circle 9, represents the mean normal level for each parameter. Concentric circle, 10, indicates maximum acceptable deviation from a mean normal level. Concentric circle, 11, marks the start of critical parameter levels requiring emergency action. The space between the circle 10 and 11 represents a region of abnormal conditions that do not require immediate reaction. The space between circles 9 and 10 represents normal operation and the space bounded by circle 11 represents critical conditions. The premise behind the normalized deviation presentation of data is that the eye has a limited zone, for a given eyeball position, over which it can provide good resolution and intelligent interpretation. By simultaneously plotting related parameters on a common graphic display and causing all indications that require rapid critical judgments to move to the center of the display, a means for improving the flow of complex information to the judgment centers of the brain is realized. Compressing less important deviations makes them less distracting and better focuses the attention on the important deviation areas. The region between maximum allowable deviations for normal operation, and the onset of critical operation, is a useful region for fault prediction and fault analysis. No deviation compression occurs here. For this example, the radically extended markings indicate positive deviations from the mean level and the angularly extended markings indicate positive deviations.

Figure 2:
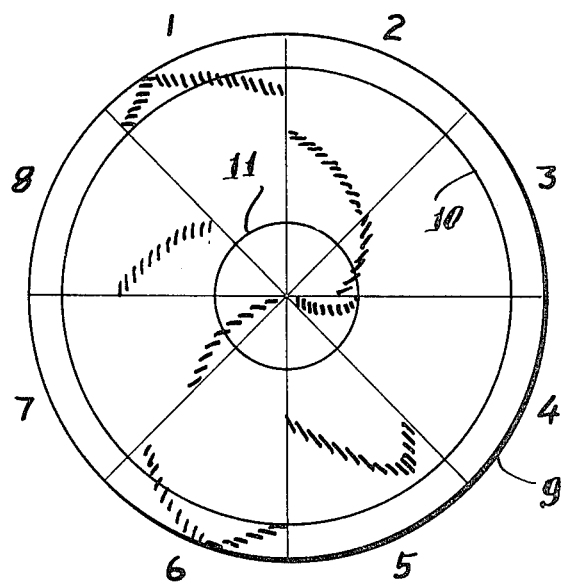
FIG. 2 illustrates how time progression occurs in the display pattern.

FIG. 2 illustrates how this real time histogram progresses with time. The extreme clockwise marking in each wedge sector, 1-8, represents the newest data while the markings in the extreme counter clockwise angular position indicates the oldest data. As new data is fed in, the histogram pattern progresses in a counter clockwise direction, for this example.

Figure 3:
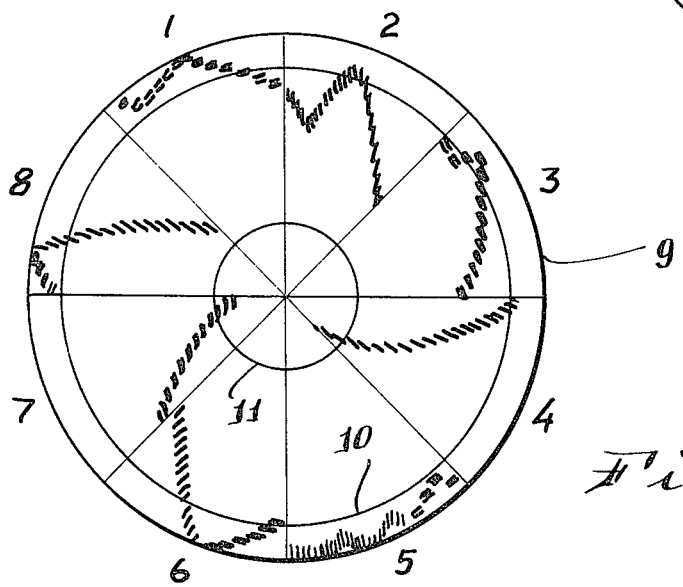
FIG. 3 illstrates a method for increasing the information content of the basic display pattern.

FIG. 3 illustrates how a display can be made to contain more data. Sector 1a, illustrates a marking that consists of four overlapping markings falling within a given angular unit. For this example, the four markings are negative. The radial thickness of the marking now provides information as to how much change has occurred during the marking interval. The relationship with adjoining markings helps indicate the direction of change. Similarly in sector 2a, four positive markings have occurred causing a radial widening of the marking. Again, each marking's relationship with its adjoining marking gives a sense of direction of change.

FIG. 4 and FIG. 5 illustrate an apparatus design that can be employed to implement the display. FIG. 4 illustrates the deviation normalization and processing circuit, 13, which is used to process the voltage representing each parameter. Potentiometer 14 and amplifier 16 are used to roughly normalize the signal fed to opto-resistor 18. Opto-resistor 18 provides an isolated, voltage variable resistance in which a photo sensitive resistance changes as the voltage controlled light intensity changes. Opto-resistor 18 is part of wheatstone bridge 20. Adjustable resistor 22 is used for fine nulling which establishes a mean normal level. Amplifier 23 provides isolation and some gain. Diode 24 and adjustable resistor 26 are used to control the compression of positive deviations from the mean level and diode 24a and adjustable resistor 26a provide compression for negative deviations. Adjustable resistors 28 and 28a establish the normalized maximum allowed deviation for acceptable operation. Adjustable resistor 30 provides display centering. Transistor 31 amplifies and isolates signals to operate the subsequent network of zener diodes and adjustable resistors that control the normalization of the critical zones for both positive and negative deviations and also controls the degree of compression that results when signals pass into the critical zone. Adjustable resistor 32 and zener diode-adjustable resistor 33, in conjunction with zener diodes 34 and 35, normalize the critical voltage levels while the values of resistor 34a and 35a determine the degree of compression provided for post critical levels. Transistor 36 provides isolation.

FIG. 5 illustrates the display generating apparatus. A signal processor-normalizer, 13, is provided for each parameter being monitored and is connected to assigned terminals of a commutating switch 38, which is stepped through all positions by a voltage fed to it from stepping counter 50. The momentarily sampled voltages are then fed into analogue to digital converter 39. The parallel outputs from the counter are fed into digital memory 40. Ring counter, 44, sequentially reads data stored in memory 40 into series voltage controlled switches 56a–f in series with resistors 58a–f. The resistor values have a binary relationship to each other in that 58a is twice 58b which is twice 58c, etc.

As ring counter 44 reads out the stored data from 116 memory elements, in memory 40, the last 12 steps of the 128 step counter are tied together to feed step counter 50. Step one of counter 50 dumps the stored data from memory 40 into memory 42. Step 2 erases the data in memory 40. Steps 3–10 actuate commutator 38 and A/D converter 39. Step 11 dumps the data stored in memory 42 back into memory 40 with each line shifted 8 places. Step 12 then erases memory 42. This completes the data shift in preparation for receiving new data.

Master clock, 60, which times the entire display, is divided by 128 in divider 62. The divided output is used to phase lock sine wave generator 54 which drives both the y axis of a CRT through isolated modulator 53 and the x axis through a 90° phase shifter and isolated modulator 55. The output of binary resistor network 58a–f adjusts the loss of both modulators. This provides circular electronic beam quadrature sine wave motion that is synchronized to the master clock. The radius of the circle is instantaneously controlled by the summed output current from binary resistor network 58a–f. The beam position is marked by actuating the z axis. The z axis is energized by a circuit comprised of subtraction circuit 64, divider circuit 66, differentiator 72 and one shot multivibrator 74, whose output energizes the z axis.

Divider 66, for this example, divides by 16 and drives divider, 68, which, with one shot multivibrator, 70, inserts one pulse count into subtraction circuit 64 for every n clock pulses, where n is the product of the two divisors of dividers 66 and 68. This subtracted pulse causes an angular progression in the display. For example, if the display has 8 sectors, and the divisor of divider 68 is 8, the marking will progress, in a clockwise direction, one angular unit for every 8 points plotted. If divider 68 were to divide by 32, then four markings would occur in a single angular unit and the number of data points stored on the screen is increased by a factor of 4.

In order to indicate positive or negative deviations from the mean accepted level of each parameter, an angular extension of each marking is created to indicate a negative deviation and a radial extension to indicate a positive deviation. The most significant digit of the conventional binary code is used to actuate the sign. For example, a zero on line 90 would indicate a negative deviation. This closes switch 78 permitting one shot multivibrator 76 to insert a much wider pulse onto the z axis than what multivibrator 74 generates, thereby extending the radial marking width.

When a pulse is fed out on line 90, gate 98 is opened and high frequency oscillator 86 is fed into modulators 55 and 57 to widen the radial marking and indicate a negative deviation.

Other types of displays such as LED and LCD matrices would be instrumented somewhat differently. Where a continuously progressing histogram is not required, mechanical displays, using sensitized paper on a rotating turntable, with an electrically controlled radial displacement and marking by electrical discharge can be used.

I claim:

1. A display or multiple measured parameters that is comprised of real time plotted deviations, from an acceptable mean level, of a number of measured parameters; each plot being located in an assigned wedge-like sector; said sectors being arranged in a circular display area, with the respective points of the sectors being located at the center of said circular display area; said plots using relative angular displacement, within each sector, to represent time and using radial distance from the periphery of the display area to represent the normalized magnitude of the deviation of the respective parameters from their respective mean levels; said plots presenting the normalized magnitude of recent past deviations of the respective parameters from their mean levels as well as the present deviations thereof; whereby the viewer can see the present and recent past deviations of each respective parameter for enabling the viewer to form judgments of the particular trends of the respective parameters being measured and whereby as the deviations of a parameter become larger the plot approaches closer to the point of its wedge-like sector, thereby approaching nearer to the center of the circular pattern where it is closer to the center of the viewer's gaze.

2. A display, as claimed in claim 1, wherein prioritized annular zones marked, so that data falling within an identified, concentric zone along the outer periphery of the circular display area, indicates deviations from mean levels that are acceptable, while data falling within a much smaller concentric circle at the center of the display area indicates critical deviations requiring emergency remedial action.

3. A display as claimed in claims 1 or 2 in which the deivations plotted in the outer periphery annular zone, representing acceptable deviations, are compressed to de-emphasize their visual distraction.

4. A display, as claimed in claims 1 or 2, in which deviations plotted in both the outer periphery annular zone and the center circle, representing acceptable and critical deviations are compressed to de-emphasize both of their visual distraction.

5. A display as claimed in claim 1 in which the direction of the deviation is indicated by the choice of symbols used to plot marks on respective sectors of the display.

6. A display, as claimed in claim 1, that is continuously updated by erasing the oldest data, rotating the remaining data relative to the respective sectors of the display area, and inserting fresh data in the cleared angular space of each respective sector, while retaining said remaining data.

7. A display generating method that efficiently communicates the status of an ongoing process or system that is comprised of, selecting parameters to be measured that together will characterize the process or system operation, and converting all parameter measurements into electrical voltages or currents, establishing mean acceptable levels, maximum acceptable deviations and critical deviations for all parameters, normalizing all said voltages so that all three said levels correspond to the same voltage, for each parameter, compressing voltage deviations in some ranges, with respect to other ranges, so as to de-emphasize their visual distraction, periodically sampling and storing said deviation voltages, generating display plots within assigned wedge-like sectors that fall in a circle, in which plots of said mean levels, for each parameter fall along the outer periphery of said circle, plots of said maximum acceptable deviations, either positive or negative, fall within a somewhat smaller diameter concentric circle and plots of said critical deviations fall within a much smaller diameter concentric area, said markings regularly progressing by angular rotation until each said sector is filled, at which time the earliest measured date is erased from said storage, and remaining data is advanced and new data inserted, with said markings coded to indicate the deviation sign.

8. Apparatus for efficiently presenting a multiplicity of parameters that characterize an ongoing process or system is comprised of, means for converting mean acceptable voltage levels of all measured parameters, into equal voltages, means for converting acceptable maximum positive and negative deviations from said mean levels, into other equal voltage levels for all parameters, means for converting critical deviations from said mean levels to other equal voltage levels for all parameters, means for compressing voltage differences between said mean and maximum acceptable deviations as contrasted to the difference between said maximum acceptable and critical deviations, means for regularly sampling all said normalized voltages of all said parameters, means for storing the magnitude of said sampled voltages, means for dislaying said stored sampled voltages in assigned wedge sectors arranged in a circular-like pattern, means for regularly advancing the angular rotation of the markings in each wedge sector with time in such a manner that the angular position of each marking in each said sector is indicative of the same time period, means of presenting said markings such that said mean levels fall on outer periphery of circle, or arc, and said critical levels fall within a much smaller circle, or arc, that is concentric with said larger circle or arc, means for regularly erasing earliest stored data, replacing it with new data and angularly advancing all remaining stored data, and a coded marker means for indicating whether deviations from the established mean levels are positive or negative.

9. Apparatus for visually presenting the condition of a process or system is comprised of, an adjustable amplifier that roughly normalizes each input parameter's voltage level, a wheatstone bridge, with one arm containing a resistance whose magnitude is controlled by the parameter's voltage to null the bridge when a specified voltage representing the mean acceptable parameter level occurs, two diode/resistor networks, one for positive and one for negative deviations from said mean level, with one set of resistor values selected for desired compression and a second set of resistor values selected for an output in which all maximum acceptable deviations from said mean level, in both a positive and negative direction, produce approximately the same voltage, a second diode-resistor network pair, to define positive and negative critical deviations from said mean levels so that said critical deviations produce approximately the same voltage and another set of resistor values selected to provide suitable compression for all voltages going beyond said critical deviations, a commutator switch that regularly samples said normalized processed voltages for each parameter, an analogue to digital converter which converts said samples into binary numbers, a digital memory that stores said binary numbers, periodically reading them out, erasing the oldest stored numbers, shifting all remaining numbers and inserting fresh numbers into the resulting emptied spaces, and a display screen upon which data representing each parameter falls within an assigned wedge sector, all sectors arranged in a circular pattern, with mean acceptable parameter levels falling on the outer periphery of said circle, and critical deviations from said mean falling within a smaller concentric circule and with positive and negative deviations indicated by symbols.

10. An apparatus for simultaneously and continuously displaying a multiplicity of real time parameter deviations in wedge-like sectors arranged in a circle with radial and angular displacements indicating deviations and time is comprised of, a cathode ray tube with x, y and z axis controls, means for shifting the phase of the sine wave applied to the x (or y) axis 90° with respect to the same sine wave applied to the y (or x) axis while retaining constant levels, means for simultaneously controlling the magnitude of said sine wave voltage applied to both the x and y axis by a digital command representative of the normalized magnitude of the deviation of each parameter from a mean accpetable level, means for generating said sine wave from a voltage originated by a master clock signal that is frequency divided to phase lock an oscillator operating at said sine wave frequency, means for generating markings on the CRT via z axis control by dividing said master clock signal by a number equal to the number of angularly displaced markings allocated for each wedge sector, using said divided output to fire a one shot multivibrator which controls the z axis display time, and means for causing said markings to progress angularly by eliminating every nth clock impulse from said divider input where n is the numer of angularly displaced markings allocated per sector times the number of sectors times the number of times that marking is to be repeated in each angular display unit.

11. Same as claimed in claim 10 including means for graphically indicating whether deviations from said mean levels are positive or negative by using the most significant binary digit to either activate an extra wide z axis marking pulse generator, for positive (or negative) deviations, or to activate a high frequency oscillator, for negative (or positive) deviations, and said oscillator modulates said sine wave applied both to the x and y axis.

12. A method of displaying monitored parameters which conveniently and efficiently reveals to a viewer the status of an ongoing process or system comprising the steps of:

selecting parameters to be monitored that will characterize the operation of the process or system, monitoring said parameters, predetermining acceptacle deviations of each respective parameter from its respective desired value, providing a circular display area divided into a plurality of sectors, each sector corresponding to a respective parameter, providing an annular zone in said circular display area near the periphery of said display area, plotting the normalized values of said monitored parameters in the respective sectors with angular displacement of each plot in its sector representing elapsed time and radial displacement inward from the periphery of said circular display area representing the deviation of the normalized value of the parameter from its respective desired value, and expanding or compressing the respective normalized values for causing their respective plots to fall within said annular zone so long as the respective monitored parameter does not deviate from its desired value beyond the predetermined acceptable deviation thereof and for causing each respective plot to progress inward from said zone as the respective monitored parameter deviates beyond its predetermined acceptacle deviation.

13. The method of displaying monitored parameters which conveniently and efficiently reveals to a viewer the status of an ongoing process or system, as claimed in claim 12, comprising the further steps of:

predetermining a critical deviation of each respective parameter from its respective desired value, providing an inner area on said circular display area for showing those parameters whose deviations have reached the critical deviation, and further expanding or compressing the respective normalized values for causing their respective plots to progress inward to said inner area when the respective monitored parameter reaches its critical deviation.

14. The method as claimed in claim 12 or 13, including the steps of:

keeping each sector full of its respective plot by erasing the portion of the plot representing monitored data earlier than present time by a predetermined amount, angularly shifting each plot in its respective sector, and plotting the normalized value of the presently monitored parameter at the end of the shifted plot.

* * * * *